(12) United States Patent
Wiesinger et al.

(10) Patent No.: US 9,594,139 B2
(45) Date of Patent: Mar. 14, 2017

(54) SYSTEMS AND METHODS FOR MAGNETIC RESONANCE BONE DEPICTION

(71) Applicant: General Electric Company, Schenectady, NY (US)

(72) Inventors: Florian Wiesinger, Garching (DE); Dattesh Dayanand Shanbhag, Bangalore (IN); Laura Irene Sacolick, Garching (DE); Sandeep Suryanarayana Kaushik, Bangalore (IN)

(73) Assignee: General Electric Company, Niskayuna, NY (US)

( * ) Notice: Subject to any disclaimer, the term of this patent is extended or adjusted under 35 U.S.C. 154(b) by 512 days.

(21) Appl. No.: 14/229,464

(22) Filed: Mar. 28, 2014

(65) Prior Publication Data

US 2015/0276906 A1     Oct. 1, 2015

(51) Int. Cl.
  *G01R 33/56*     (2006.01)
  *G01R 33/48*     (2006.01)

(52) U.S. Cl.
  CPC ..... *G01R 33/5608* (2013.01); *G01R 33/4816* (2013.01); *G01R 33/4824* (2013.01)

(58) Field of Classification Search
  CPC ............ G01R 33/5608; G01R 33/4816; G01R 33/4824
  See application file for complete search history.

(56) References Cited

U.S. PATENT DOCUMENTS

| | | | |
|---|---|---|---|
| 9,135,695 B2* | 9/2015 | Pereira | G06T 7/0012 |
| 2007/0080685 A1 | 4/2007 | Bydder et al. | |
| 2007/0255129 A1 | 11/2007 | Du et al. | |
| 2010/0261993 A1 | 10/2010 | van der Kouwe et al. | |
| 2011/0286649 A1 | 11/2011 | Reisman et al. | |
| 2012/0076378 A1 | 3/2012 | Keereman et al. | |
| 2013/0083987 A1* | 4/2013 | Novak | G06T 7/0083 382/131 |

(Continued)

OTHER PUBLICATIONS

Hoffmann, Matthias et al., "MRI-Based Attenuation Correction for PET/MRI: A Novel Approach Combining Pattern Recognition and Atlas Registration", The Journal of Nuclear Medicine, vol. 49, No. 11, Nov. 2008; DOI:10.2967/jnumed.107.049353, (pp. 1875-1883, 9 pages total).

(Continued)

*Primary Examiner* — Rodney Bonnette
(74) *Attorney, Agent, or Firm* — Melissa K. Dobson

(57) ABSTRACT

Systems and methods of classifying component tissues of magnetic resonance images, where the method includes performing a proton density weighted, short echo-time magnetic resonance imaging measurement over a first volume field-of-view region of interest (ROI), repeating a series refining the first volume field-of-view ROI into a plurality of subsequent smaller ROI volumes having respective smaller resolutions, reconstructing a complex image from the plurality of magnetic resonance imaging measurements, performing a bias correction on at least one of the plurality of subsequent smaller ROI volumes, and classifying the ROI volumes by tissue type based on the bias-corrected image signal, wherein at least one tissue type is bone. A non-transitory medium containing processor instructions and a system are disclosed.

21 Claims, 14 Drawing Sheets

(56) References Cited

U.S. PATENT DOCUMENTS

2013/0265050 A1   10/2013   Grodzki et al.
2013/0336553 A1*  12/2013   Buisseret .............. G06T 7/0083
                                                            382/128

OTHER PUBLICATIONS

Hafner, S. "Fast Imaging in Liquids and Solids With the Backprojection Low Angle ShoT (BLAST) Technique", Magnetic Resonance Imaging, vol. 12, No. 7, 1994, 0730-725X(94)00054-9, (pp. 1047-1051, 5 pages total).

Grodzki, David M. et al., "Correcting slice selectivity in hard pulse sequences", Journal of Magnetic Resonance, 214, 2012, DOI:10.1016/j-jmr.2011.10.005, (pp. 61-67, 7 pages total).

Chen, Lili et al., "MRI-Based Treatment Planning for Radiotherapy: Dosimetric Verification for Prostate IMRT", Int. J. Radiation Oncology Biol. Phys. vol. 60, No. 2, 2004, DOI:10.1016/j.ijrobp.2004.05.068, (pp. 636-647, 12 pages total).

Catana,Ciprian et al., "Toward Implementing an MRI-Based PET Attenuation-Correction Method for Neurologic Studies on the MR-PET Brain Prototype", The Journal of Nuclear Medicine, vol. 51, No. 9, Sep. 2010, DOI:10.2967/jnumed.109.069112, (pp. 1431-1438, 8 pages total).

Wu, Yaotang et al., Water- and Fat-Suppressed Proton Projection MRI (WASPI) of Rat Femur Bone, Magnetic Resonance in Medicine, No. 54, (2007) DOI: 10.1002/mrm.21174, (pp. 554-567, 14 pages total).

Wollenweber, S. D. et al., "Evaluation of an Atlas-based PET Head Attenuation Correction Using PET/CT and MR Patient Data", 2012, IEEE Nuclear Science Symposium and Medical Imaging Conference Record (NSS/MIC), DOI: 10.1109/NSSMIC.2012.6551925, (pp. 4048-4053, 6 pages total).

Weiger, Markus et al., "MRI with Zero Echo Time: Hard versus Sweep Pulse Excitation", Magnetic Resonance in Medicine, vol. 66, (2011), DOI: 10.1002/mrm.22799, (pp. 379-389, 11 pages total).

Wagenknecht, Gudrun et al., "Knowledge-based Segmentation of Attenuation-relevant Regions of the Head in T1-weighted MR Images for Attenuation Correction in MR/PET Systems", IEEE Nuclear Science Symposium Conference Record, 2009, M09-287, DOI: 10.1109/NSSMIC.2009.5401751, (pp. 3338-3343, 6 pages total).

Weiger, Markus et al., "Sweep MRI with Algebraic Reconstruction", Magnetic Resonance in Medicine, (2010), DOI:10.1002/mrm.22516, (pp. 1-11, 11 pages total).

Weiger, Markus et al., "Direct Depiction of Bone Microstructure Using ZTE Imaging", Proc. Intl. Soc. Mag. Reson. Med. vol. 19, (2011), (p. 563, 1 page total).

Rad, Hamidreza Saligheh et al., "Quantifying cortical bone water in vivo by three-dimensional ultra-short echo-time MRI", NMR in Biomedicine, vol. 24, Issue 7, 2011, (wileyonlinelibrary.com) DOI:10.1002/nbm.1631, (pp. 855-864, 10 pages total).

Kops, Elena Rota et al., "Alternative Methods for Attenuation Correction of PET Images in MR-PET Scanners", IEEE Nuclear Science Symposium Conference Record 2007 M26-112, (pp. 4327-4330, 4 pages total).

Robson, Matthew D. et al., "Clinical Ultrashort echo time imaging of bone and other connective tissues", NMR in Biomedicine, 2006, vol. 19, D0I:10.1002/nbm.1100, (pp. 765-780, 16 pages total).

Rahmer, Jurgen et al., "Three-Dimensional Radial Ultrashort Echo-Time Imaging with T2 Adapted Sampling", Magnetic Resonance in Medicine, vol. 55, (2006), DOI:10.1002/mrm.20868, (pp. 1075-1082, 8 pages total).

Rahmer, Jurgen et al., "3D Ultrashort Echo-Time Imaging of the Head", Proceedings of the International Society for Magnetic Resonance in Medicine, vol. 13, (2005), (p. 1074, 1 page total).

Madio, David P. et al., "Ultra-Fast Imaging Using Low Flip Angles and FIDs", Magnetic Resonance in Medicine, vol. 34, (1995) DOI:10.1002/mrm.1910340407, (pp. 525-529, 5 pages total).

Keereman, Vincent et al., "Challenges and current methods for attenuation correction in PET/MR", Magnetic Resonance Mater Phy, 2012, DOI: 10.1007/s10334-012-0334-7, 18 pages total.

Keereman, Vincent et al., "MRI-Based Attenuation Correction for PET/MRI Using Ultrashort Echo Time Sequences", The Journal of Nuclear Medicine, Vo. 51, No. 5, May 2010, DOI: 10.2967/jnumed.109.065425, (pp. 812-818, 7 pages total).

Jonsson, Joakim H. et al., "Treatment planning using MRI data: an analysis of the dose calculation accuracy for different treatment regions", Radiation Oncology, 2010, Vo. 5:62, DOI: 10.1186/1748-717X-5-62, (8 pages).

Kops, Elena Rota et al., "MRI Based Attenuation Correction for Brain PET Images", Advances in Medical Engineering, (pp. 93-97, 5 pages total).

Johansson, Adam et al., "CT substitute derived from MRI sequences with ultrashort echo time", Medical Physics, vol. 38, No. 5, May 2011, DOI: 10.1118/1.3578928, (pp. 2708-2714, 7 pages total).

Grodzki, David M. et al., "Ultrashort Echo Time Imaging Using Pointwise Encoding Time Reduction with Radial Acquisition (PETRA)", Magnetic Resonance in Medicine, (2011), DOI: 10.1002/mrm.23017, (pp. 1-9, 9 pages total).

Robson, Matthew D. et al., "Magnetic Resonance: An Introduction to Ultrashort TE (UTE) Imaging", J. Comput. Assist. Tomogr, vol. 27, No. 5, Nov./Dec. 2003, p. 825-846, 22 pages total).

Cline, Harvey E. et al., "MR-Guided Focused Ultrasound Surgery", Journal of Computer Assisted Tomography, vol. 16, No. 6, Nov./Dec. 1992 (pp. 956-965, 10 pages total).

Martin, Ernst et al., "High-Intensity Focused Ultrasound for Noninvasive Function Neurosurgery", Annals of Neurology, vol. 66, No. 6, Dec. 2009, DOI: 10:1002/ana.21801, (pp. 858-861, 4 pages total).

McDannold, Nathan et al., "Transcranial Magnetic Resonance Imaging-Guided Focused Ultrasound Surgery of Brain Tumors: Initial Findings in 3 Patients", Neurosurgery, vol. 66, No. 2, Feb. 2010, DOI: 10.1227/01. NEU.0000360379.95800.2F, (pp. 323-332, 10 pages total).

Schlesinger, David et al., "MR-guided focused ultrasound surgery, present and future", Medical Physics, vol. 40, No. 8, Aug. 2013, DOI: 10.1118/1.4811136, (pp. cover p. 1 + 080901-1 to 080901-32, 33 pages total).

Du, Jiang et al., "Short T2 contrast with three-dimensional ultrashort echo time imaging", Magnetic Resonance, vol. 207, (2010), DOI: 10.1016/j.jmr.2010.09.013, (pp. 304-311, 8 pages total).

Du, Jiang et al., "Qualitative and quantitative ultrashort echo time (UTE) imaging of cortical bone", Journal of Magnetic Resonance vol. 29, (2011), DOI: 10.1016/j.jmr2010:11.003, (pp. 470-482, 13 pages total).

Weiger, Markus et al., "ZTE Imaging in Humans", Magnetic Resonance in Medicine, vol. 70, (2013), DOI: 10.1002/mrm.24816, (pp. 328-332, 5 pages total).

Wong, Sam T.S. et al., "A Strategy for Sampling on a Sphere Applied to 3D Selective RF Pulse Design", Magnetic Resonance in Medicine, vol. 32, (1994), DOI: 10.1002/mrm.1910320614, (pp. 778-784, 7 pages total).

Jackson, John I. et al., "Selection of a Convolution Function Fourier Inversion Using Gridding", IEEE Transactions on Medical Imaging, vol. 10. No. 3, Sep. 1991, DOI: 10.1109/42.97598, (pp. 473-478, 6 pages total).

Beatty, Philip J. et al., "Rapid Gridding Reconstruction With a Minimal Oversampling Ratio", IEEE Transactions on Medical Imaging, vol. 24, No. 6, Jun. 2005, DOI: 10.1109/TMI.2005.848376, (pp. 799-808, 10 pages total).

Thiruvenkadam, Sheshadri R. et al., "A PDE Based Method for Fuzzy Classification of Medical Images", IEEE Transactions on Medical Imaging, 2006, DOI: 10.1109/ICIP.2006.312639, (pp. 1805-1808, 4 pages total).

Kapur, J. N. et al., "A New Method for Gray-Level Picture Thresholding Using the Entropy of the Histogram", Computer Vision, Graphics, and Image Processing, vol. 29 (1985), DOI: 10.1016/0734-189X/85-90125-2, (pp. 273-285, 13 pages total).

Johnson, Hans J. et al., "The ITK Software Guide: Updated for ITK version 4.5", Third Edition, Dec. 17, 2013, [Clifton Park, NY]: Kitware, 752 pages.

(56) References Cited

OTHER PUBLICATIONS

Kops, Elena Rota et al., "Template based Attenuation Correction for PET in MR-PET Scanners", IEEE Nuclear Science Symposium Conference Record, 2008, DOI: 10.1109/NSSMIC.2008.4774281, (pp. 3786-3789, 4 pages total).
Samarin, Andrei et al., "PET/MR imaging of bone lesions—implications for PET quantification from imperfect attenuation correction", Eur. J. Nucl. Med. Mol. Imaging, vol. 39, (2012), DOI: 10:1007/s00259-012-2113-0, (pp. 1154-1160, 7 pages total).
Yoo, Terry S. et al., "Engineering and Algorithm Design for an Image Processing API: A Technical Report on ITK—the Insight Toolkit", Stud. Health Technol. Inform., vol. 85, (pp. 586-592, 7 pages total), Pub date 2002.
Visvikis, Dimitris et al., "PET/MR attenuation correction: where have we come from and where are we going?", Eur. J. Nucl. Med. Mol. Imaging, 2014, DOI: 10.1007/s00259-014-2748-0, 4pgs.

\* cited by examiner

SYSTEMS AND METHODS FOR MAGNETIC RESONANCE BONE DEPICTION

BACKGROUND

In contrast to X-ray transmission imaging, conventional Magnetic Resonance Imaging (MR or MRI) is intrinsically less suited for the depiction and segmentation of cortical bone structures. Besides musculoskeletal applications, MR bone imaging has gained increased importance for applications like MR-based attenuation correction in PET (Positron Emission Tomography)/MR, MR-based radiation therapy planning, and MR-guided focused ultrasound.

Because of low proton density (~20% of water) and short signal lifetimes (T2 ~0.4 msec at 3 T), there are challenges to apply MRI techniques for depiction of solid bone structures. Conventional gradient echo, or spin echo pulse sequences with echo times (TE) in the millisecond-range are too slow for meaningful bone signal detection. Ultra-short echo time (UTE) pulse sequences with center-out k-space sampling starting immediately following the RF excitation enable fast enough MR data acquisition to capture the rapidly decaying bone signals. In order to selectively depict and segment bone, long T2 suppression methods (like echo subtraction and/or saturation pre-pulses) can be applied. However, these methods are typically slow and suffer from robustness and accuracy issues. Alternatively also atlas-based methods have been presented which add anatomical prior knowledge. However, these methods are less flexible in handling patient abnormalities, e.g. due to pathologies.

DETAILED DESCRIPTION

In accordance with embodiments, proton density (PD) weighted pulse sequences with short echo times (i.e., TE about<1 msec) can be used to capture MR bone signals. In particular embodiments based on PD-weighted ultra-short TE (UTE) and zero TE (ZTE) pulse sequences provide imaging characteristics which are ideally suited for the depiction and segmentation of solid bone structures. The accurate, robust, and fast MR depiction and segmentation of bone is an unmet need that is addressed by the embodiments disclosed herein—especially for MR-based PET attenuation correction, MR-based radiation therapy planning, and MR-guided focused ultrasound.

PD-weighted, short TE MRI can be implemented in the form of a RUFIS-type (Rotating Ultra-fast Imaging Sequence) ZTE pulse sequence and optimized for efficient capture of both short T2 bone signals, and flat PD contrast for soft tissues. A logarithmic image scaling can be used to highlight bone and differentiate it from surrounding soft-tissue and air. Furthermore, a bias correction method is applied as a pre-processing step for subsequent threshold-based 3-class (air, soft-tissue, bone) segmentation. In accordance with embodiments, the segmentation can be augmented by utilizing the complex MRI data (in terms of phase) to provide improved differentiation of overlapping magnitude intensities of air and bone signals.

Figure 1A:
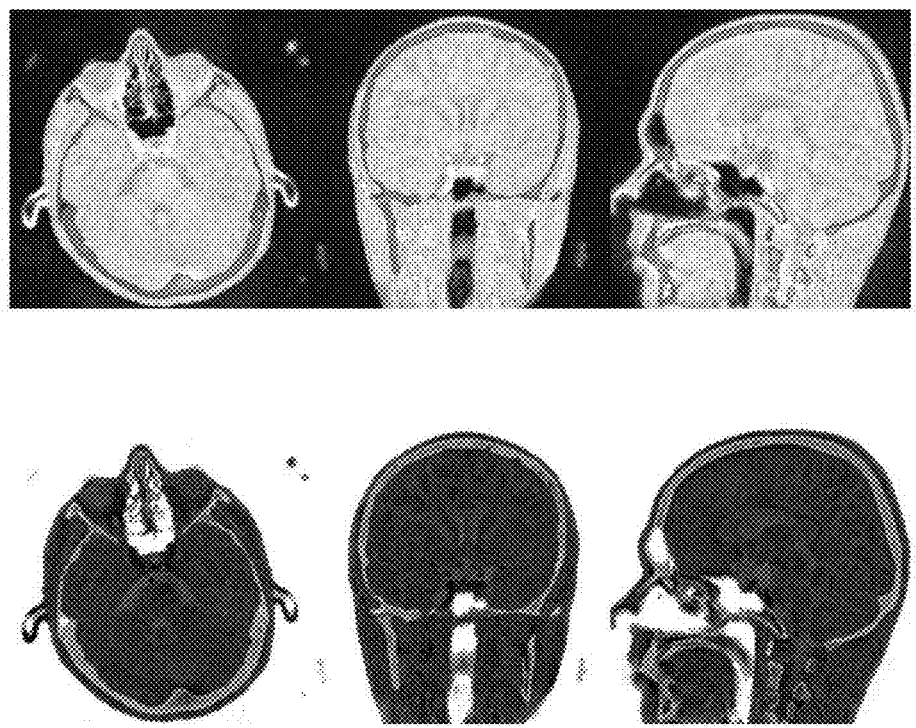
FIG. 1A depicts a high-resolution ZTE MRI head scan in three orthogonal views in accordance with some embodiments.

In accordance with embodiments, high bandwidth ZTE imaging (e.g., imaging bandwidths of ±31.25 kHz, ±62.5 kHz and ±125 kHz, where ±62.5kHz can provide satisfactory trade-off between SNR efficiency and signal decay) in combination with an inverse logarithmic scaling provides excellent depiction of cortical bone tissue. As an example, FIG. 1A depicts a high-resolution ZTE MRI head scan acquired in ~5min using an imaging bandwidth of ±62.5 kHz, flip angle of 1.2 deg in three orthogonal views in linear (top row) and inverse-log scale (bottom row). In combination with RF bias correction these techniques achieve excellent bone segmentation. In accordance with embodiments, these results are achieved without the need to rely on echo subtraction, preparation pulses, and/or anatomical prior knowledge. Intrinsic characteristics of ZTE MRI are in particular motion-insensitive 3D radial sampling, nominal TE=0, sub-millisecond repetition times (TRs), and minimal gradient ramping, providing robust and efficient performance.

Figure 1B:
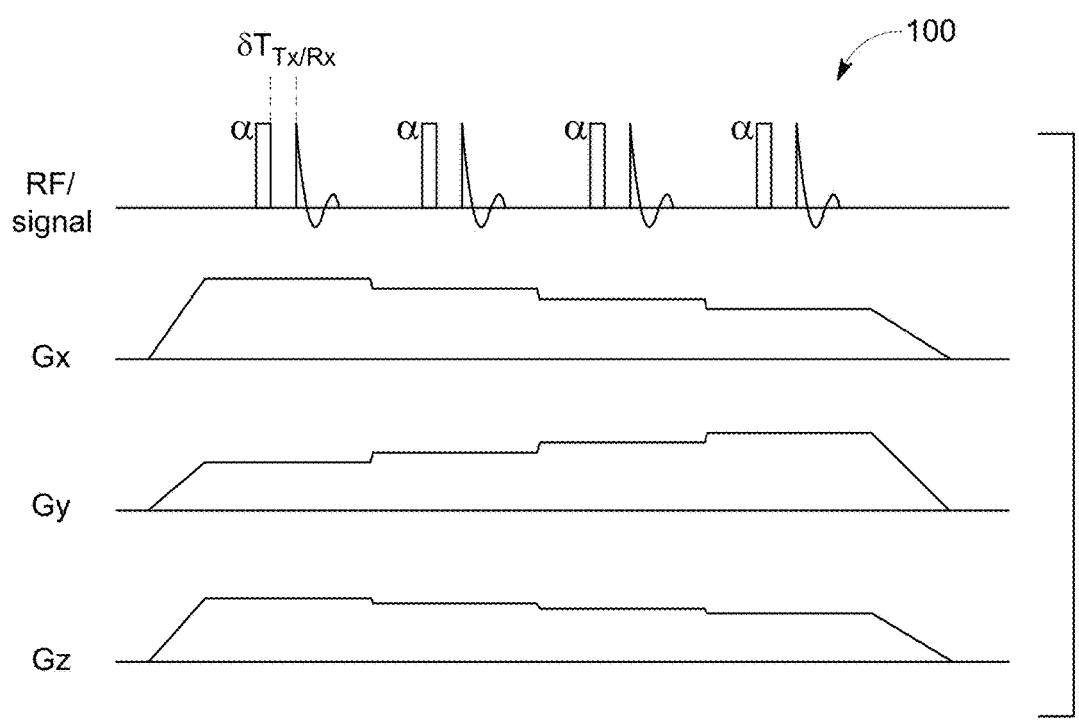
FIG. 1B depicts an illustration of a short TE pulse sequence with RF signal and gradient activity in accordance with some embodiments.

FIG. 1B depicts a RUFIS-type ZTE pulse sequence with RF signals 100 along with gradient waveforms Gx, Gy, Gz in accordance with some embodiments. The ZTE pulse sequence includes a non-selective hard pulse excitation followed by 3D center-out radial sampling. In accordance with embodiments, the readout gradients are not ramped down between repetitions. Accordingly, image encoding starts immediately at full speed at the time of spin excitation leading to a nominal TE=0, with the nominal TE defined as the center k-space echo time and quiet scanning. The pulse sequence was grouped into segments, each containing a certain number of spokes. In accordance with some implementations, typically there can be 128, 256, or 512 spokes per segment. This grouping allows interleaving pre-pulses for contrast preparation, chemical shift selective saturation, and/or motion navigators.

In accordance with some implementations, the imaging readout gradients Gx, Gy, Gz can be kept active during the RF pulsing with only small directional updates in between repetitions, resulting in a nominal TE=0 and quiet scanning. The pulse sequence is grouped into segments (one segment shown here) to interleave preparation pulses and/or motion navigators. Each data acquisition contains a non-selective RF excitation (block pulse) with flip angle alpha followed by 3D radial signal readout.

In accordance with implementations, the excitation bandwidth can be wider than the imaging bandwidth so that the imaging gradients do not significantly disturb spin excitation. For typical B1 amplitudes of clinical whole-body MR scanners (~15 µT) this leads to flip angles of a few degrees maximum, resulting in native PD-weighted image contrast. The PD-weighted imaging provides uniform, low-contrast soft-tissue signals response, which is advantageous for subsequent bias correction and segmentation steps. Particularly for the differentiation of soft-tissue from bone and air. The short TE (nominal TE=0) in combination with high imaging bandwidth provides efficient capture of bone signals and its distinction from background air. The minimal gradient ramping and short RF pulsing translates into fast and SNR-efficient scanning with sub-millisecond TRs.

The radial spokes were sequentially-ordered along a spiral path with uniform sampling of the 3D k-space. This uniform sampling allows incremental updates of the gradient switching between repetitions, resulting in robustness to eddy currents and virtually silent scanning. For a certain field-of-view (FOV) and matrix size (N), the number of radial spokes corresponding to Nyquist sampling at the k-space periphery is $\pi N^2$. In order to keep the acquisition time short and avoid aliasing artifacts, the number of spokes can be reduced to $N^2$. Along the radial direction twofold oversampling can be applied. Three-dimensional image reconstruction is accomplished using standard 3D gridding. In accordance with some implementations, scan time can be further shortened and/or image quality improved using more advanced image reconstruction methods including parallel imaging and compressed sensing in combination with regularization schemes.

Phantom and in-vivo volunteer experiments were conducted on a GE 3T MR750w scanner, equipped with a GEM HNU head receive array (GE Healthcare, Waukesha, Wisc.).

Figure 2:
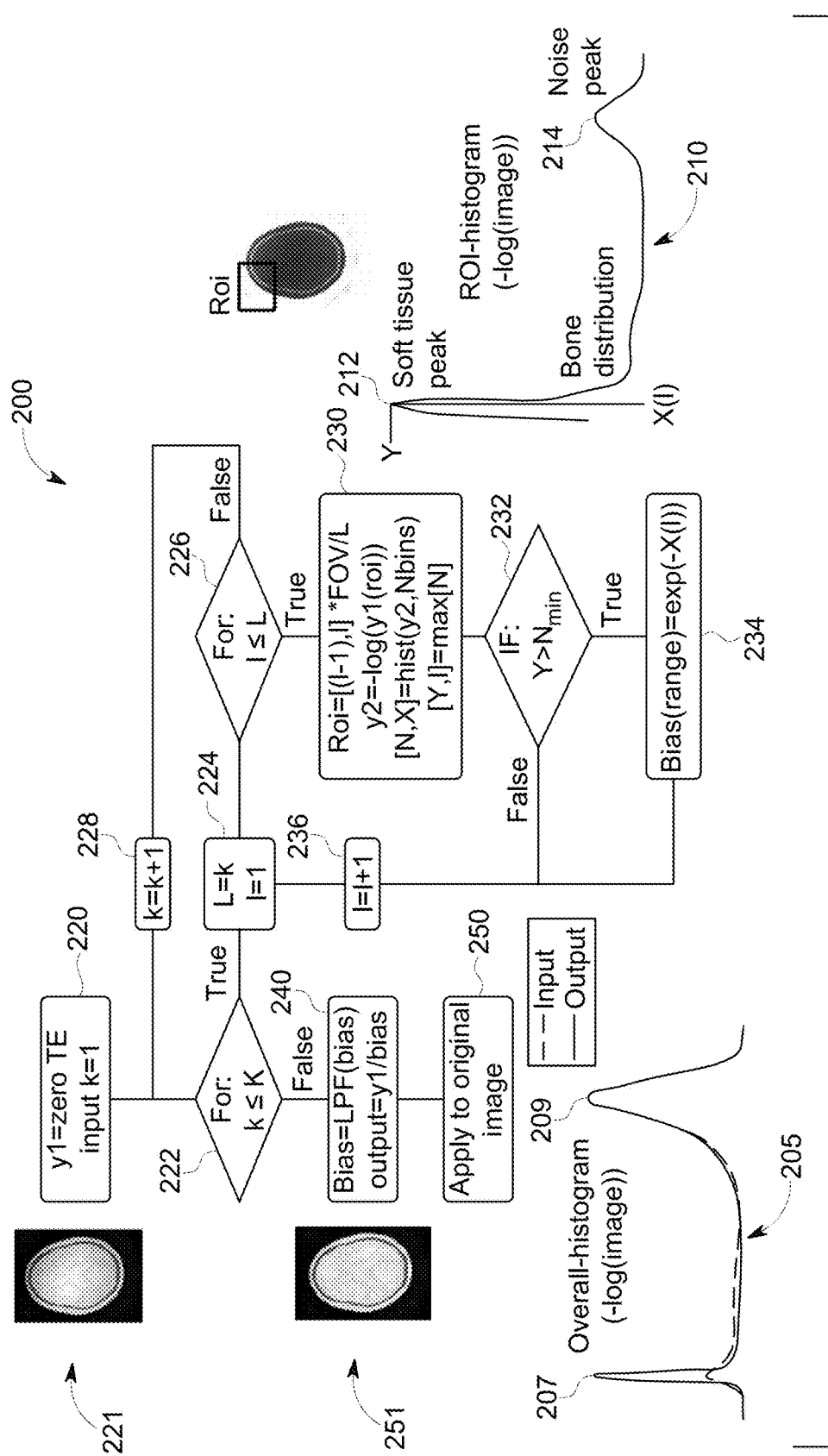
FIG. 2 depicts a process flow diagram of a histogram-based RF bias correction method in accordance with some embodiments.

FIG. 2 depicts multi-resolution, histogram-based RF bias correction process 200 in accordance with some embodiments. This is one approach to implement an RF bias correction taking advantage of the flat PD image contrast in accordance with embodiments. In accordance with some implementations, other bias correction techniques can be performed. In accordance with embodiments, the image is considered (e.g., an approximation) to consist of only two major compartments—i.e., soft tissue (including white matter, gray matter, cerebrospinal fluid, muscle, fat, etc.) and background air. This approximation is confirmed by the image histogram 205 of the log-scaled ZTE image, which contains only two major peaks (corresponding to soft-tissue 207 and noise 209) but does not resolve the individual soft tissues.

Image 221 is representative of an uncorrected input image, and shows non-uniformity of intensity in its soft tissue component(s). Image 251 shows greatly enhanced image uniformity, and is representative of an image after correction in accordance with embodiments. The soft-tissue signal distribution is broadened by the spatially non-uniform RF transmit and receive sensitivities. Image histogram 210 depicts a smaller region-of-interest (ROI) with less variation of the sensitivity profiles. As illustrated, soft tissue signal peak 212 becomes significantly narrower. The soft tissue signal in this ROI can be approximated by the location of the signal peak. Based on this observation, in accordance with embodiments, RF bias correction process 200 includes (i) dividing the 3D image dataset into ROIs; and (ii) normalizing pixels within a certain ROI by the signal intensity of the corresponding soft tissue peak.

Process 200, in accordance with embodiments, is depicted in the flowchart of FIG. 2. The outer-loop (steps 220-228) performs a multi-resolution approach starting with a single ROI covering the full 3D volume and refining to smaller ROIs in subsequent iterations. The inner-loop (steps 230-236) performs a histogram-based bias correction and image normalization for a ROI at a specific resolution. For purposes of description, Matlab syntax is used to describe the histogram (hist) and maximum (max) operations. The bias correction factor for a specific ROI is updated if sufficient signal statistics is available; otherwise the value from the last iteration is retained. After the multi-resolution bias correction is finished, the obtained bias field is low-pass filtered (LPF), step 240, eliminating the checkerboard pattern from the discrete ROIs. The LPF bias field is then applied, step 250, to the original input image. In some implementations, besides bias correction, process 200 can also provide image normalization by assigning soft-tissue a value of one.

In accordance with embodiments, a method is based on the flat proton-density (PD) weighted contrast and assumes soft-tissues to be approximately indistinguishable within the considered ROIs. The improved signal uniformity can be clearly appreciated from the images and the overall histogram distribution (left).

Embodying systems and methods for MR bone depiction and segmentation can be applied for MR-based PET attenuation correction in PET/MR, MR-based radiation therapy planning (RTP), and/or MR-guided focused ultrasound (FUS). Because of bone's high attenuation value, it needs to be accounted for accurately—especially for neurological applications in the head and neck, but also other body regions. However, while soft-tissue and air can be segmented well using MRI accurate, robust, and fast bone segmentation is much more challenging.

Prior bone segmentation attempts explored T2 differences between bone (short T2-0.39 msec at 3T) and soft-tissue (long T2-100 msec). However, these attempts require multi-echo readouts and/or the use of saturation pulses. Both of which have issues regarding accuracy, robustness and speed. Besides UTE, also methods exploring anatomical prior-knowledge in form of bone atlases or templates have been presented. However, these methods are less flexible to account for patient abnormalities which for instance can occur as a result of certain pathologies.

Methods and systems in accordance with embodiments disclosed herein explore PD differences between bone and soft tissues using PD-weighted short TE imaging. Because these embodying methods and systems neither require multi-echo acquisition, nor preparation pulses, nor anatomical prior knowledge, their results are more accurate, more robust, and/or faster compared to existing methods. The MR acquisition is done with a short TE (to capture the rapidly decaying bone signals) and flat PD contrast (required for bias correction and segmentation). From the available options, UTE and/or zero TE provide favorable results. By (1) acquiring PD-weighted short TE images with parameters optimized for bone signal; (2) viewing the images with an inverse-log or other scaling to highlight low level signals; and (3) bias-correcting bone signals, the images can reliably be segmented into air, soft-tissue, and bone.

Figure 3A:
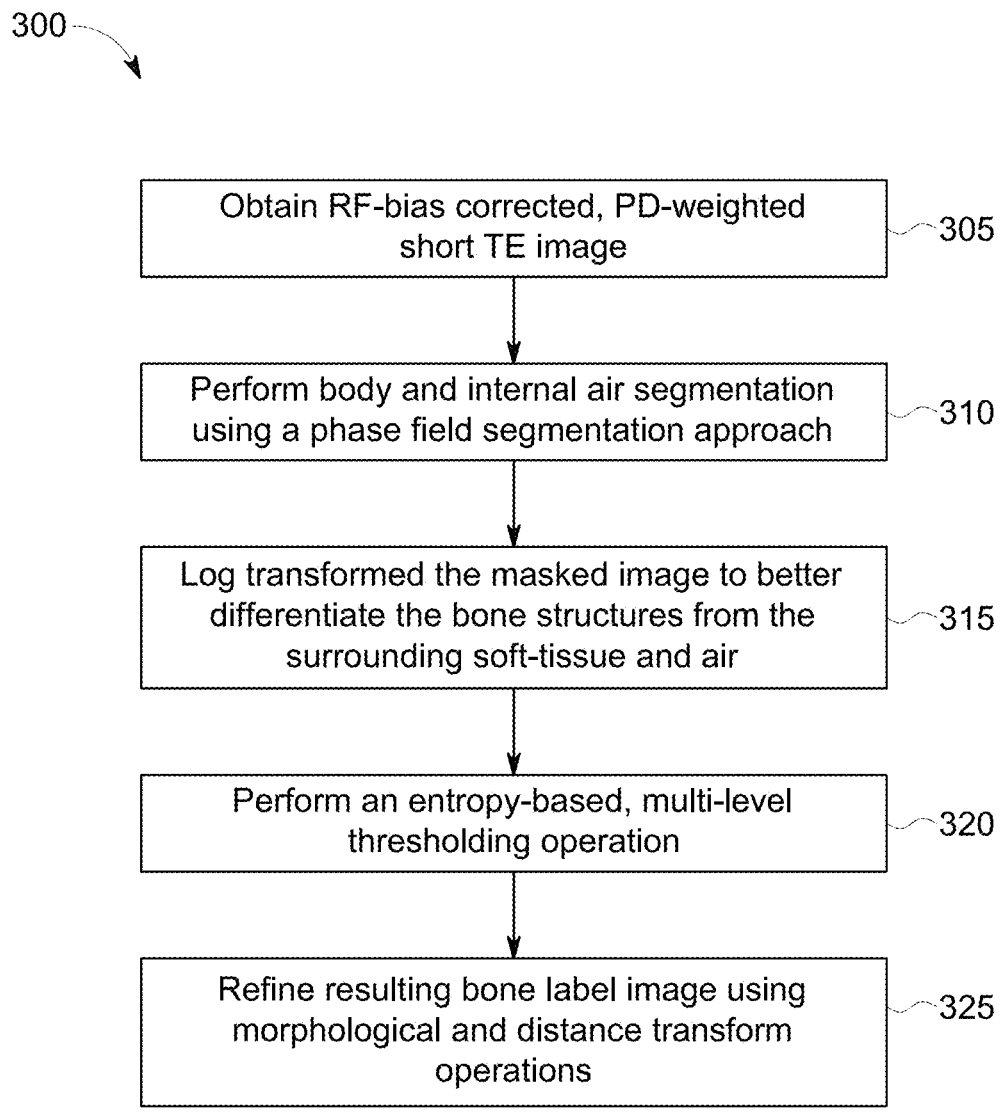
FIG. 3A depicts a process for bone segmentation of RF-bias corrected input short TE images in accordance with some embodiments.

FIG. 3A depicts bone segmentation process 300 of RF-bias corrected input PD-weighted short TE images in accordance with some embodiments. The goal of segmentation is to classify the ZTE image into four classes—background, soft tissue, bone and air. The advantage of ZTE images is that both the magnitude and phase information can be used to obtain signatures for the three classes mentioned above. The complex MRI images are represented as:

$$I(r, \theta) = r * \exp(i\theta) \quad \text{(EQ. 1)}$$

where r is the magnitude and θ is the phase.

Figure 9A:
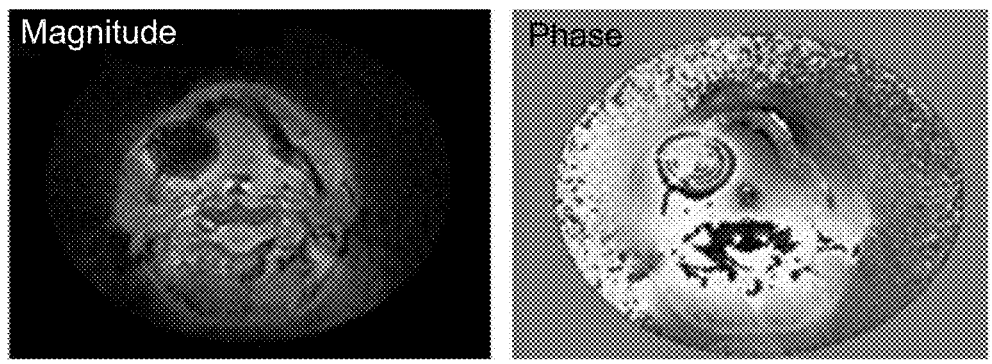
FIG. 9A depicts head images from a long TE gradient echo acquisition in accordance with some embodiments.
Figure 9B:
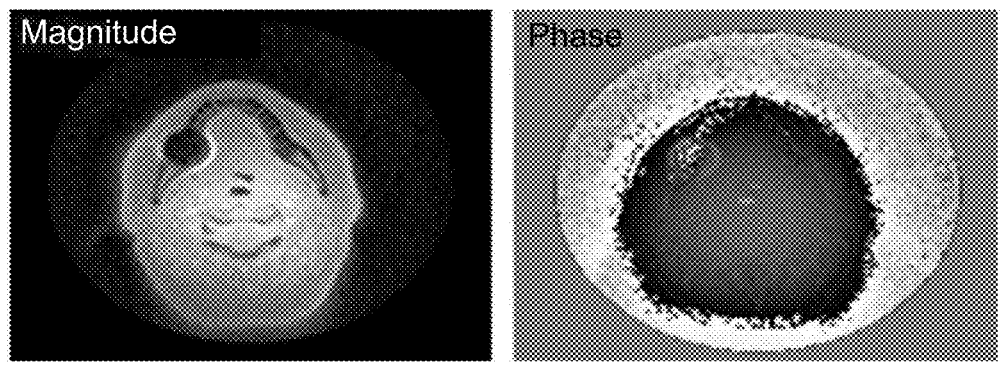
FIG. 9B depicts head images from a zero TE acquisition in accordance with some embodiments.

With reference to FIG. 9A, head images from a long TE gradient echo acquisition (e.g., ~2.3 msec) is depicted. FIG. 9B depicts head images from a zero TE acquisition. In longer echo acquisition, the phase warps and signal losses contribute to the difficulty in utilizing phase information for any reliable segmentation. In accordance with embodiments, the reliable phase information from ZTE imaging is used to further improve differentiation between air and bone.

Figure 3B:
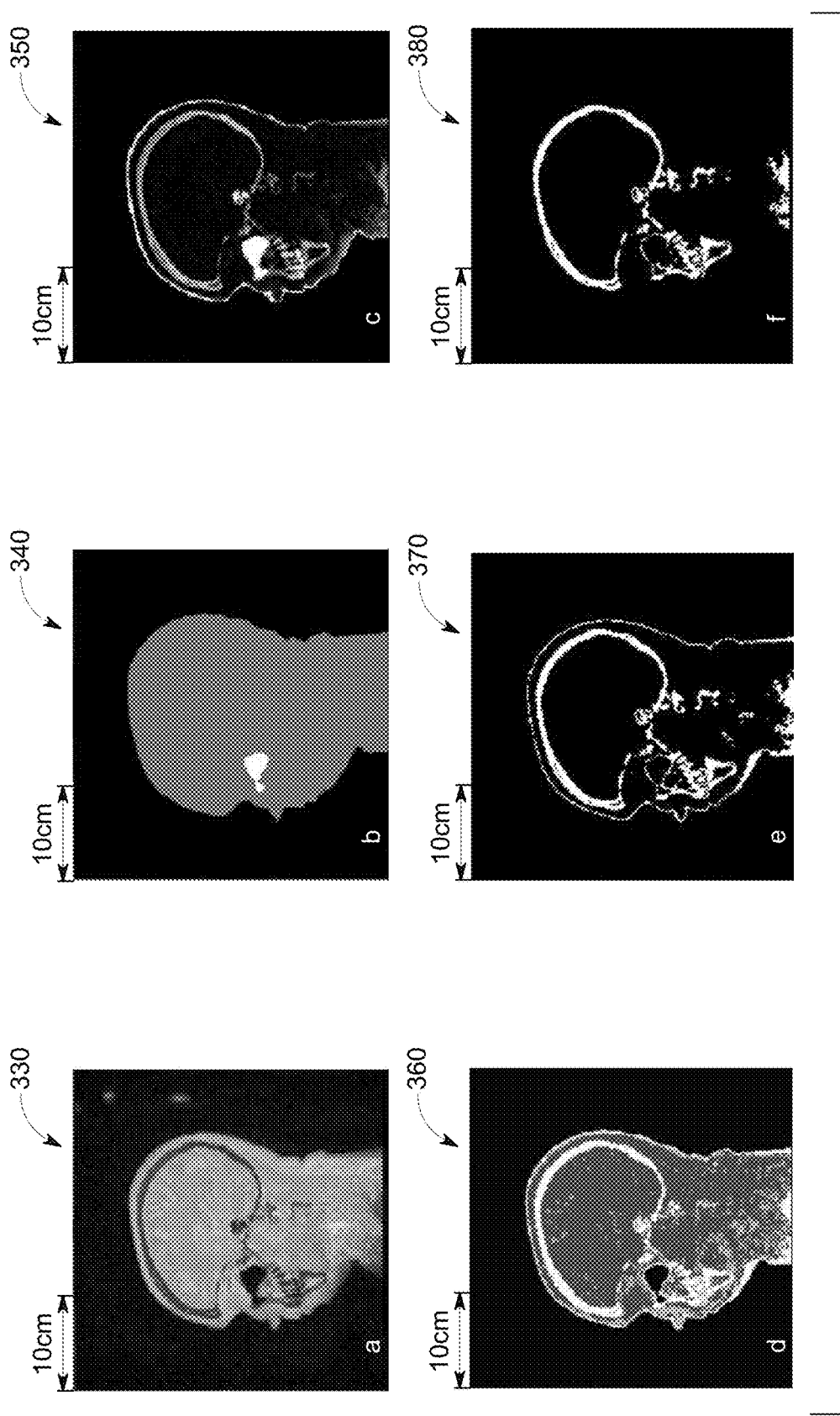
FIGS. 3B-3C depict bone segmentation of RF-bias corrected input short TE images in accordance with some embodiments.

FIG. 3B depicts images 330-380 of bone segmentation of RF-bias corrected input short TE images in accordance with some embodiments which implement a phase-field based segmentation followed by an entropy-based, multi-level thresholding technique using the MRI phase information. With regard to process 300, an RF-bias corrected PD-weighted short TE input image (image 330; FIG. 3B) is received, step 305. The body contour (to separate background) and approximate internal air segmentation is performed on magnitude images, step 310, using a phase field segmentation approach (image 340; FIG. 3B). The masked image is log transformed, step 315, to better differentiate the bone structures from the surrounding soft-tissue and air (image 350; FIG. 3B). In order to segment the three classes within the body region, at step 320, a multi-pass, multi-level thresholding is performed on log transformed data using maximum entropy metric (image 360; FIG. 3B). In accordance with some implementations, other bias correction techniques can be performed.

In the first pass of segmentation, a four class multi-level threshold yields the labels as: label 1=tissue+vertebrae, label 2=bone, label 3=air and label 4=petrous bone mixed with air. The air voxels at the rim of the body mask have similar intensity to bone voxels and are captured as bone label (label 2). These pseudo air voxels are removed using a signed distance transform from the body mask. Once the air on the surface is excluded, label=2 primarily captures the skull. Next, we mask out the voxels with labels=2, 3 and 4 in the log transformed magnitude ZTE data can be masked out. A second round of 4-class multi-level threshold on the masked data is performed. This allows the soft tissue and vertebrae classes to be separated.

The resulting bone label (label=2) (image 370; FIG. 3B) is refined, using morphologic analysis and additional distance transform based on previously identified air mask (step 325; FIG. 3A and image 380; FIG. 3B). However, this processing still retains some ambiguity in air labels (label=3) and air-bone (especially in petrous bone region) and this is where the phase information is most useful.

Figure 10A:
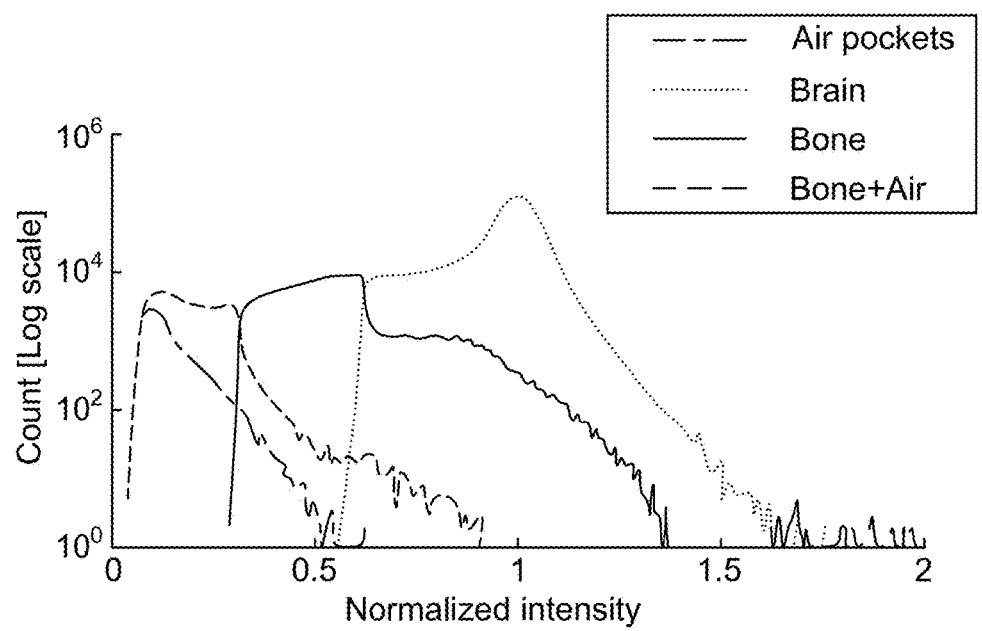
FIGS. 10A-B depict the effect of phase information in distinguishing between air and bone voxels in accordance with some embodiments.
Figure 10B:
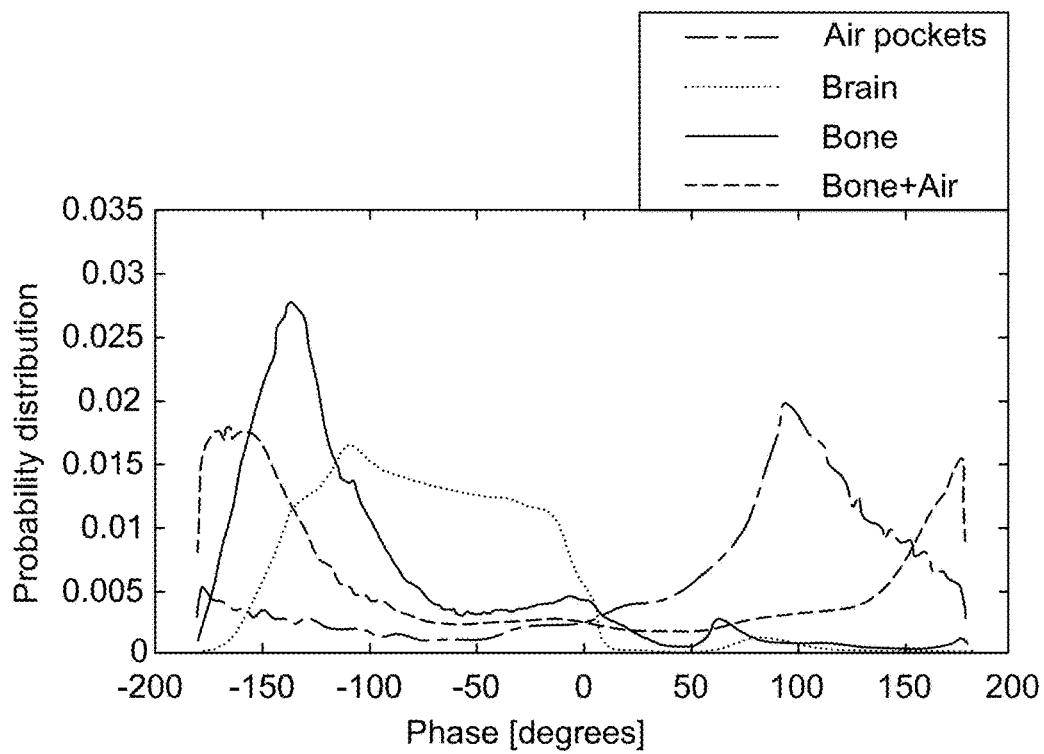

FIGS. 10A and FIG. 10B depict how the phase information provides good distinction of air voxels from bone voxels. For magnitude data, for petrous bone regions, the overlap between bone and air voxels is very high. However, for phase data, this overlap is minimal and air clearly separates out from petrous bone. Before being used for segmentation, the phase data is filtered to reduce overlap of "air" phase with bone and tissue phase data. This is achieved by tilting the air signal vector away from the bone and tissue signal vector by 180° and accomplished mathematically as:

$$I_{bias}(r, \theta) = \alpha * \sigma_{air} * \exp(i(\pi + \mu_{\theta sig})) + I(r, \theta) \quad \text{(EQ. 2)}$$

Where, α is a scaling factor;
$\sigma_{air}$ is the standard deviation of air regions; and
$\mu_{\theta sig}$ is the average signal phase.

Figure 11:
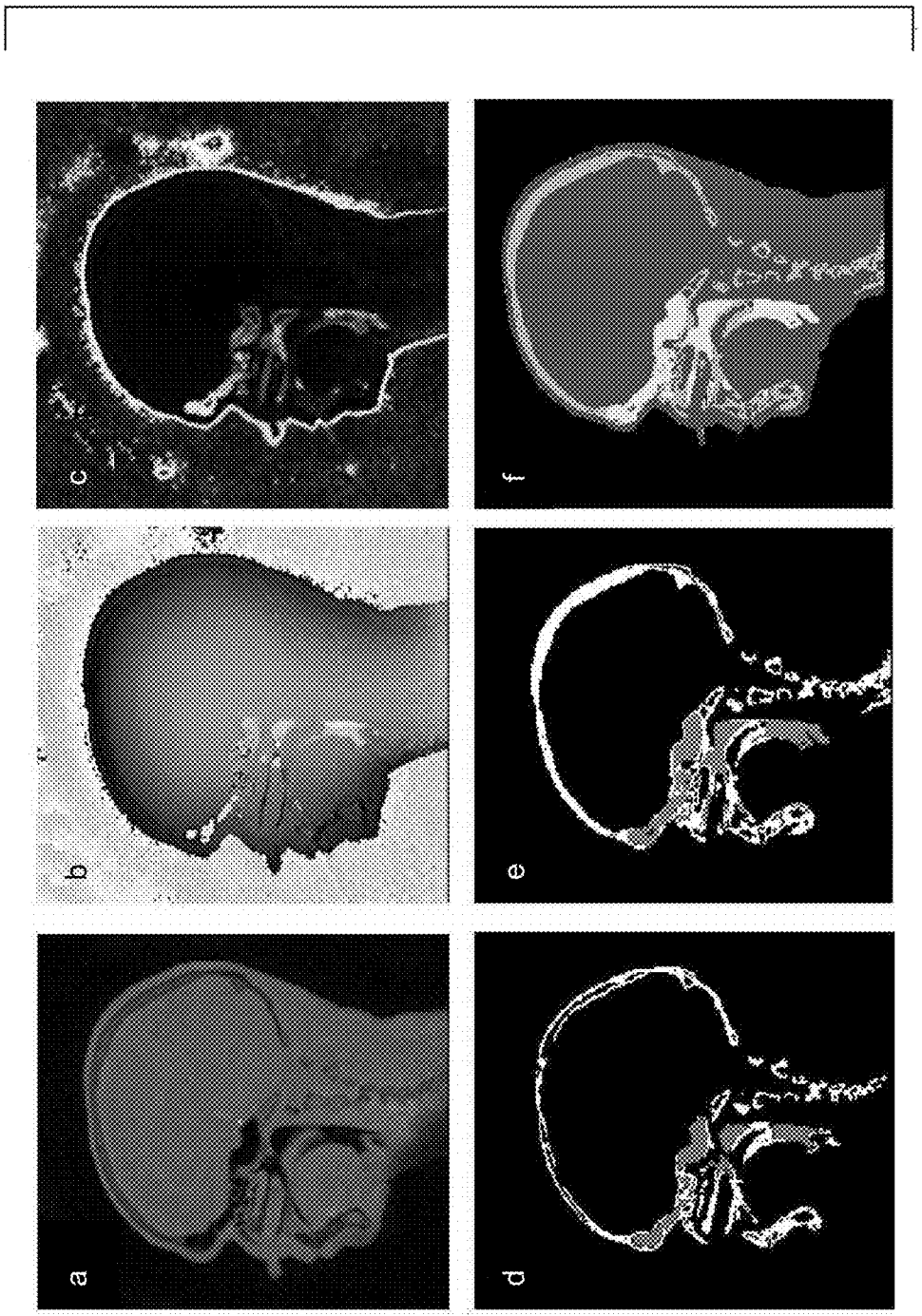
FIGS. 11A-F depict images illustrating the effect of processing in improving bone depiction and segmentation images in accordance with some embodiments.

FIG. 10B depicts a histogram of phase data that illustrates that the variation of signal phase is highest in air regions and uniformly low in soft-tissue and bone regions (i.e., the jitter in air histogram). FIG. 11c depicts a standard deviation (SD) map of phase data, and a histogram is generated for this SD map. Next, a Gaussian curve is fit to around the largest peak of the SD map histogram (mostly tissue and bone voxels) and mean and standard deviation calculated ($\mu_{std}$, $\sigma_{std}$). Air voxels were identified by setting a threshold>$\mu_{std}$+3*$\sigma_{std}$.

Alternatively, the air voxel threshold can be chosen adaptively by segmenting the air structure in equivalent CT images and carefully adjusting the threshold till it matches CT identified air volume. The air regions so obtained can be merged with label=3. The remaining pre-classified air voxels can be merged with bone label (label=2) (FIG. 11E). A final four class mask is thus obtained by combining the refined regions of: background, soft tissue region, bone+vertebrae and air (FIG. 11F).

Figure 3C:
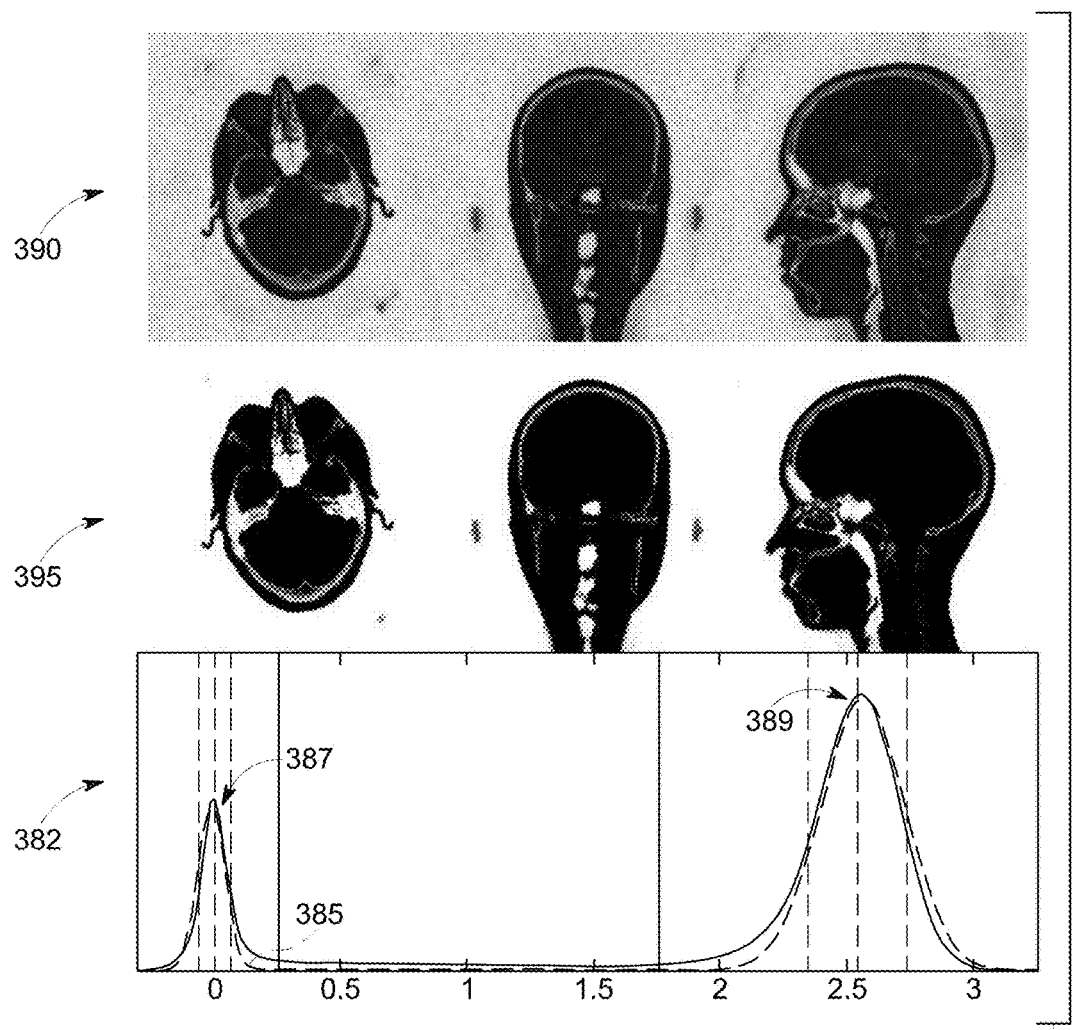

In accordance with some implementations, an alternative threshold-based segmentation method can be implemented using normalized and bias-corrected, PD-weighted short TE MR input data, resulting into the same four classes—background, soft tissue, bone, and air. For the segmentation simple thresholding can be applied using two threshold values for tissue-bone and bone-air differentiation. FIG. 3C depicts a log-scaled (i.e., –log(image)) ZTE dataset after application of the histogram-based intensity correction. Curves 382 contain the image histogram of the log-scaled image with soft-tissue 387 and noise 389 appearing as clearly distinguishable peaks.

Conversely, the bone signals are smeared in between lending more towards the soft-tissue peak on the left. Image rows 390, 395 show the ZTE images along three orthogonal views using different windowing. For row 390 the window level was adjusted to cover the full signal spectrum [−0.2, 4] ([upper, lower] values used for image windowing), whereas for the row 395 the window level was adjusted to selectively depict bone [0.15, 1.8] with soft-tissue and air appearing consistently black and white, respectively. As illustrated, two discrete threshold values allow threshold-based segmentation of zero TE images into background, soft tissue, bone, and air.

Dashed curve 385 in image histogram illustrates automatic fitting results for the soft-tissue and the noise peak using a Gaussian signal model. The obtained center peak and full-width-half-maximum information can be used to automatically derive case-specific tissue-bone and bone-air threshold values. Structures outside the head—e.g., originating from the RF coil's plastic housing, are removed using connected component analysis. Intra-body air can be distinguished from outside air via simple morphologic and distance transform operations.

Figure 4:
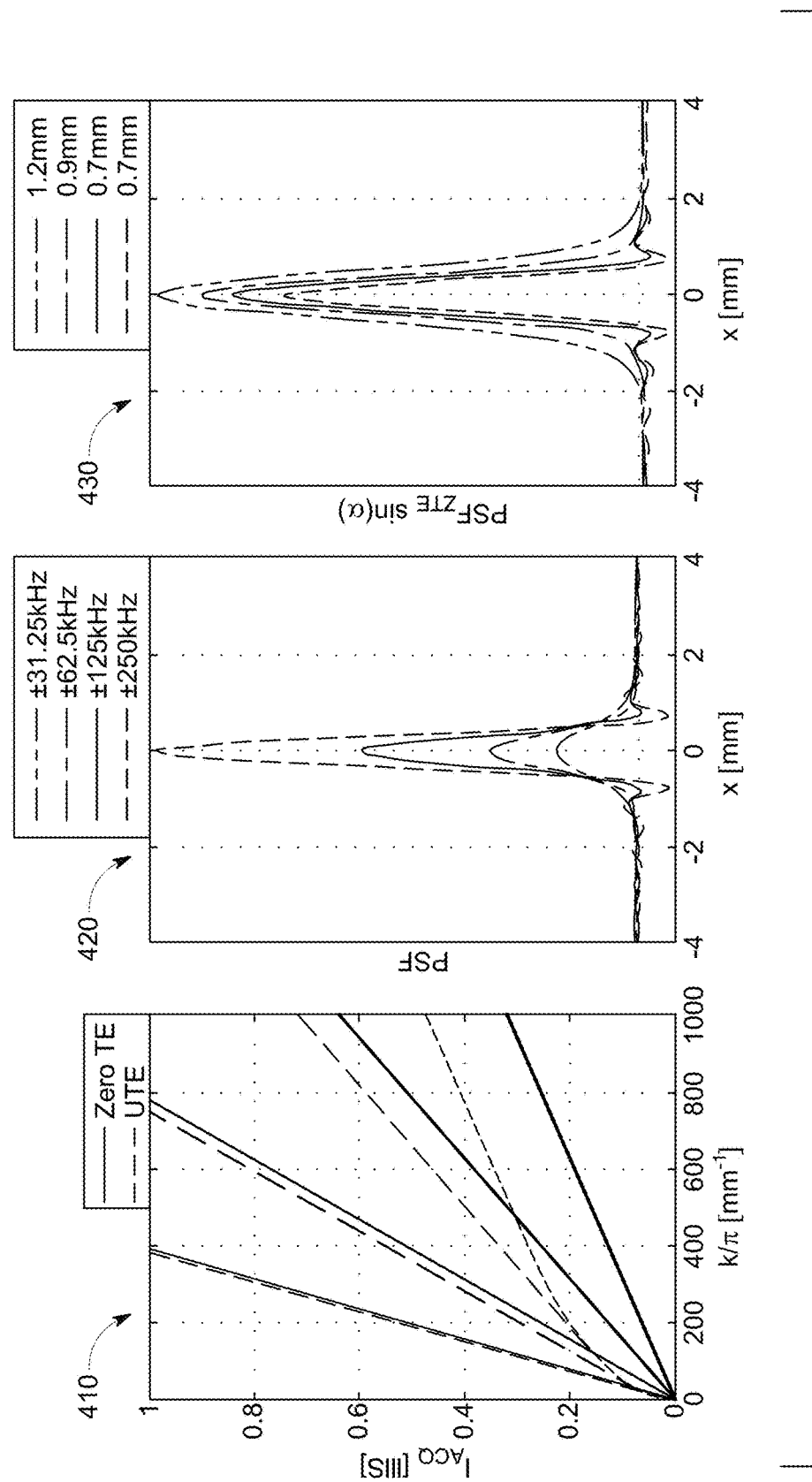
FIG. 4 depicts simulation results comparing ultra-short TE and zero TE imaging performance for different bandwidths in accordance with some embodiments.

FIG. 4 depicts simulation results 410, 420, 430 comparing ZTE and UTE imaging performance for different bandwidths in accordance with some embodiments. These simulation results illustrate a point-spread-function (PSF) analysis comparing ZTE (solid lines) versus UTE (dashed lines)

for different imaging bandwidths (color coded). The parameters assumed for this simulation are: $G_{max}$=unconstrained, $S_{max}$=120 T/m/s, T2*=0.39 msec corresponding to cortical bone at 3T(13), nominal resolution $\pi/k_{max}$=0.4 mm; with $k_{max}$ the radial k-space extend. Simulation result 410 represents the acquisition time ($T_{ACQ}$) dependent on the inverse nominal resolution $k/\pi$. ZTE distinguishes from UTE in that it does not require initial ramping of the readout gradient, resulting in a faster k-space traverser at the beginning. This speed advantage gets more apparent at higher BW and associated stronger readout gradients.

Simulation result 420 represents a central one dimensional profile of the 3D rotational symmetric PSF. The high BW and associated fast sampling minimizes $T_2$* induced signal decay and blurring. In ZTE, the maximum flip angle ($\alpha$) inversely scales with the imaging bandwidth. This additional dependence is accounted for in simulation result 430. Additionally, the SNR and scan time inversely scale with the imaging bandwidth (SNR ~$BW^{-0.5}$ and scan time ~$BW^{-1}$). However, both effects approximately cancel and do not further impact the SNR efficiency (i.e., SNR/sqrt(scan time)). Hence, neglecting relaxation and contrast effects, BW and the number of averages ($N_{avg}$) can be flexibly adjusted without affecting SNR or scan time—e.g., twofold averaged BW=±125 kHz data are obtained at similar SNR and scan time as a BW=±62.5 kHz image without averaging.

In accordance with embodiments, ZTE eliminates gradient ramping resulting in a significant speed advantage over UTE, especially for higher imaging bandwidths. The point-spread-function (PSF) simulation depicted in simulation result 420 demonstrates reduced signal decay (PSF height) and blurring (PSF width) in case of fast, high BW sampling assuming T2=0.39 ms; characteristic for cortical bone. Simulation result 430 indicates that the maximum flip angle ($\alpha$) to be inversely proportional to BW. The full-width-half-maximum (FWHM) of the PSF is listed in the figure legend as well.

Figure 5:
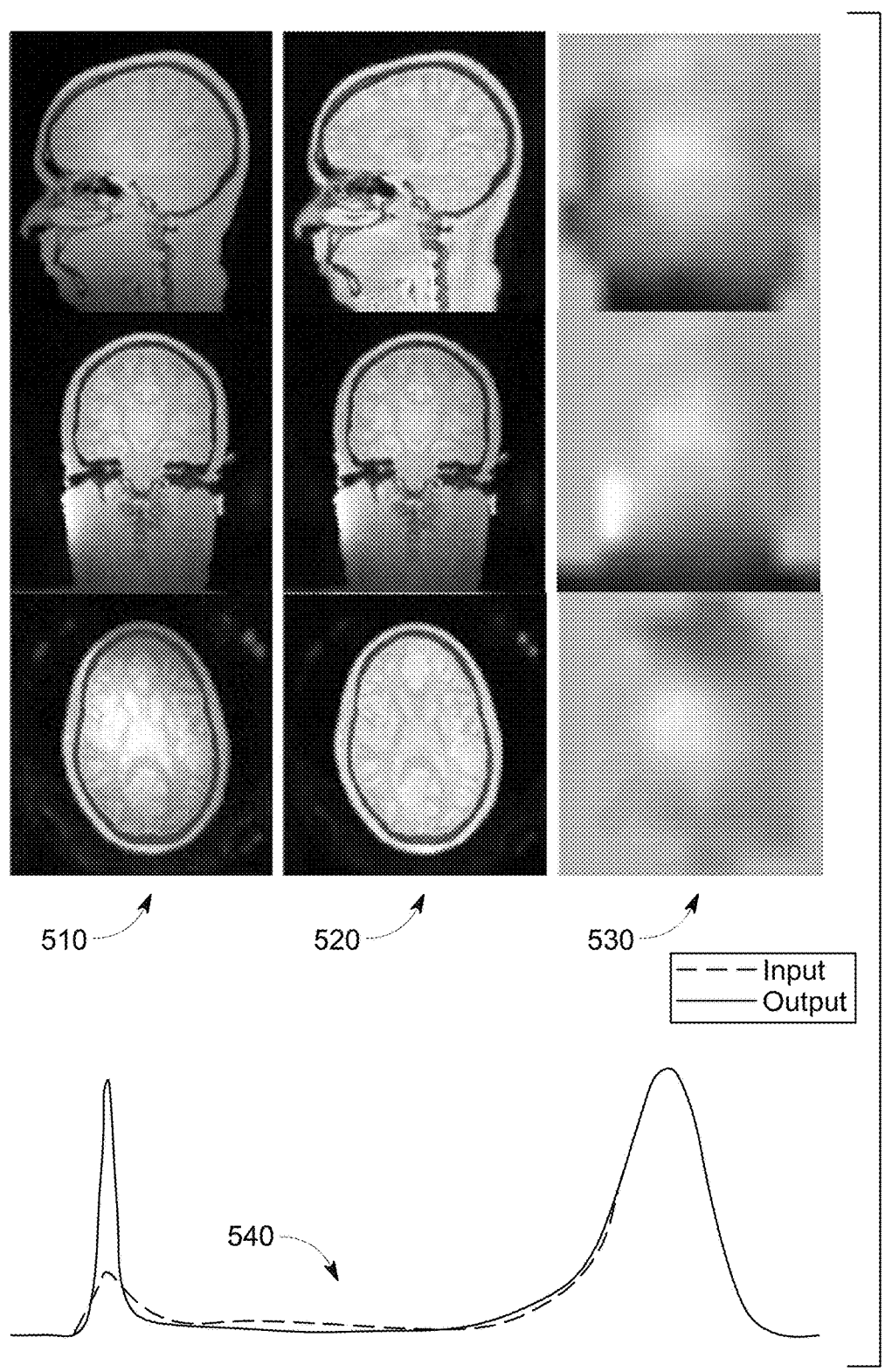
FIG. 5 depicts a multi-resolution, histogram-based RF bias correction of a head in accordance with some embodiments.

FIG. 5 illustrates images 510, 520, 530 depicting a bias correction of a head in accordance with some embodiments. These depictions compare image uniformity before (uncorrected input image 510) and after (corrected input image 520) multi-resolution, histogram-based RF bias correction with the corresponding bias field map depicted in image 530. In accordance with some implementations, other bias correction techniques can be performed. The bias correction method in accordance with embodiments significantly improves RF shading without affecting the low but still appreciable contrast behavior. Embodying methods provide image normalization with a soft-tissue signal around one. The bias correction is also apparent from the histogram distribution of the log-scaled (i.e., -log(image)) image 540, showing a significantly narrower soft-tissue distribution (left peak) after the correction. For better illustration, the histogram distributions were scaled such that the noise peaks approximately overlap.

Figure 6:
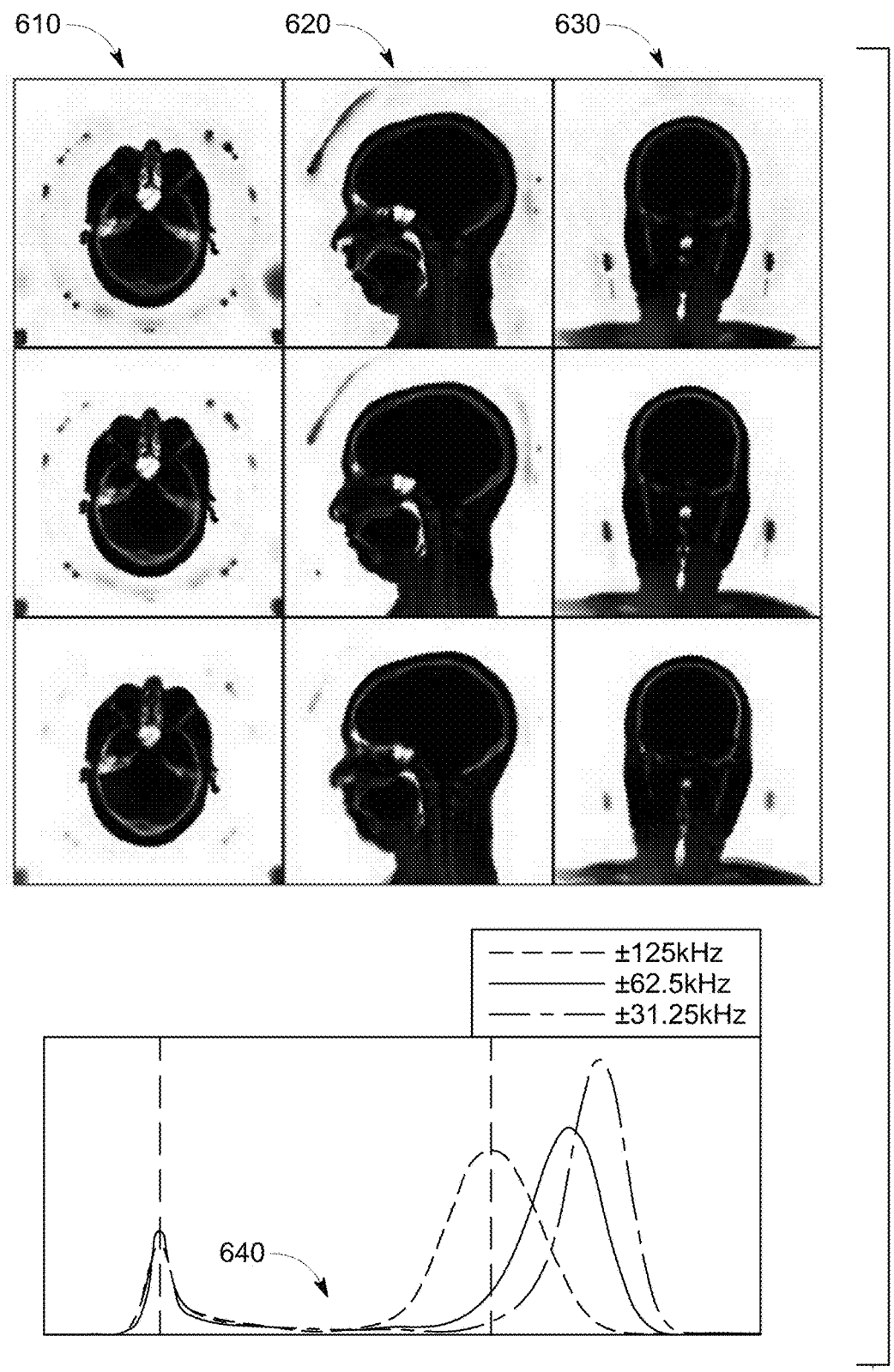
FIG. 6 depicts zero TE head images using an inverse logarithmic scale acquired at different imaging bandwidths in axial, sagittal, and coronal views in accordance with some embodiments.

FIG. 6 illustrates ZTE head images 610, 620, 630 depicted in axial, sagittal, and coronal views in accordance with some embodiments. These ZTE images provide a BW comparison. Each view compares three different imaging bandwidths (top row: BW=±125 kHz; middle row: BW=±62.5 kHz; and bottom row BW: ±31.25 kHz) before bias correction. The logarithmic scaled images appear CT-like with uniform soft tissue being cold and bone mid-tempered against a hot noise background. The highest bandwidth (250 kHz) with the fastest k-space sampling (4 µs sampling time) provides the sharpest signal response with least amount of off-resonance blurring at tissue-bone interfaces (e.g., sinuses), or subcutaneous fat beneath the skin. Conversely, the lowest bandwidth (±31.25 kHz) provided the highest SNR and soft-tissue contrast with partial saturation effects of long T1 structures like the cerebrospinal fluid. Outside the head short-lived plastic signals from the coil housing are visible as well.

In accordance with embodiments, ZTE head images 610, 620, 630 illustrate that with increasing BW, the scan time decreases while the background noise increases. In accordance with the PSF simulations of FIG. 4, ultra-short T2 structures (i.e., cortical bone and plastic from the coil housing) appear strongest and sharpest at the highest BW with the fastest sampling. With decreasing BW, off-resonance effects in the form of blurring at tissue-air interfaces, or fat layers, increase significantly.

Figure 7:
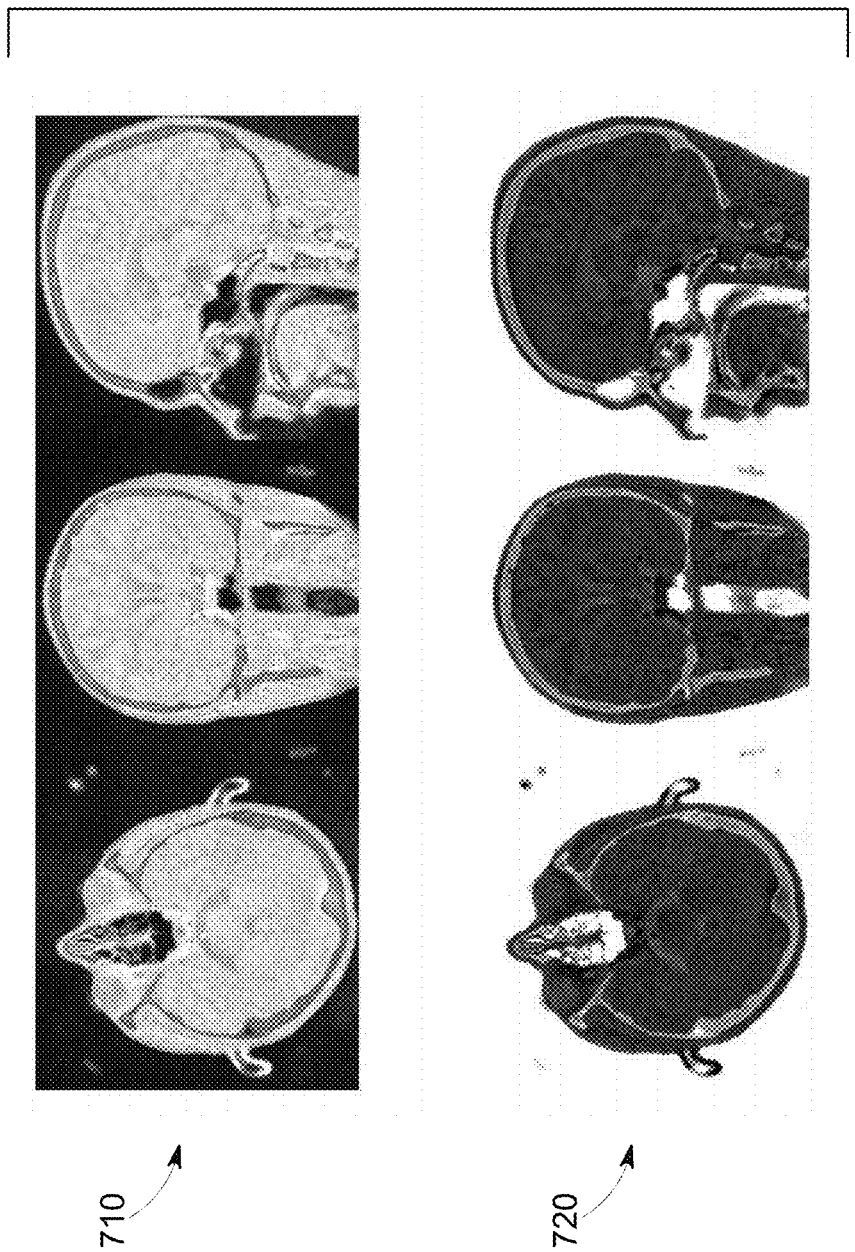
FIG. 7 depicts a high resolution, short TE image of a head in accordance with some embodiments.

FIG. 7 depicts images 710, 720 which illustrate a high resolution, ZTE image of a head in accordance with some embodiments. The results of a high resolution head scan (e.g., BW=±62.5 kHz, flip angle ~1.2°, scan time ~6 min) are shown in linear scale (image 710) and log scale (image 720) in axial (left), coronal (middle), and sagittal (right) views.

The log scaled images clearly depict the cranial and facial bones of the skull, as well as the cervical vertebrae. The high resolution, ZTE imaging in accordance with embodiments can provide detailed cortical bone depiction due to the logarithmic image scaling in combination with the flat PD-weighted contrast. As depicted in images 710, 720 this process can resolve the two parallel layers of compact bone sandwiched by the spongy bone in the cranium. As a result of the short nominal TE in combination with the high imaging bandwidth minimizes off-resonance effects at air-tissue interfaces (e.g., sinuses), or fatty tissues (e.g., skin) to a negligible level. As observed in images 710, 720 the sinuses are depicted in great detail with minimal off-resonance blurring.

Additionally, structures of the plastic coil housing are depicted as well, thus indicating the effective sampling of short-lived signals.

Figure 8:
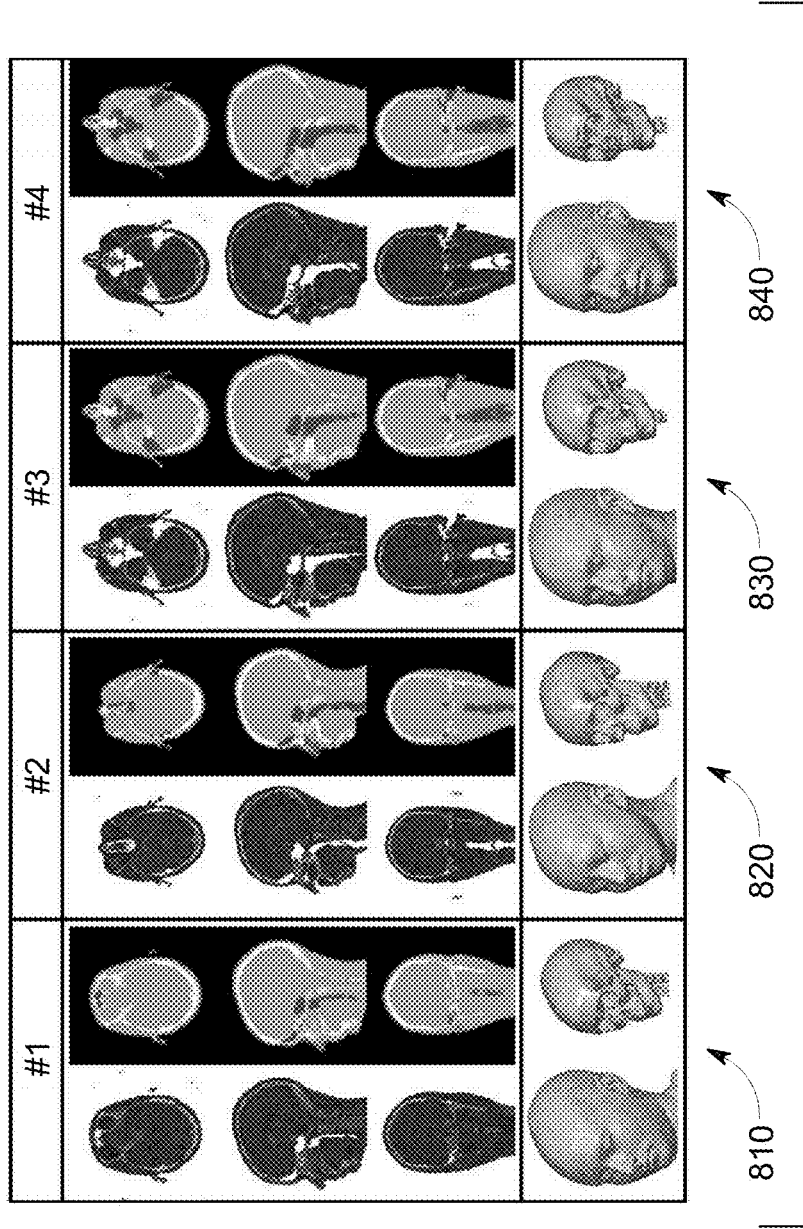
FIG. 8 depicts bone, soft-tissue, and air segmentation results and 3D rendering of a skull and a head in accordance with some embodiments.

FIG. 8 depicts images 810, 820, 830, 840 illustrating background, soft tissue, bone, and air segmentation results from a limited volunteer study (N=4) in accordance with some embodiments. For each volunteer, three orthogonal slices of the RF bias corrected images (left) and the corresponding segmentation (right) are depicted. Additionally, 3D rendered projections of the head and skull contour are depicted as well at the bottom. Fixed threshold values of 0.2 for tissue-bone and 1.3 for bone-air separation have been applied for all volunteers. The obtained segmentation results are refined using connected component analysis to remove RF coil structures. Simple morphologic and distance transform operations have been applied to remove partial voluming effects at air-tissue interfaces.

In accordance with embodiments, excellent 3D cortical bone depiction in the head can be achieved using RUFIS-type ZTE imaging. An embodying method takes advantage of specific PD-weighted, short TE imaging characteristics such as the efficient sampling of short T2 signals and flat soft-tissue contrast. Furthermore, sub-millisecond TRs and 3D radial sampling provide fast and motion-insensitive scanning. The high sampling efficiency of close to 100%, where most of the TR is used to actually acquire data, provides a flexible tradeoff between BW, number of averages, and SNR.

The minimal gradient switching in between repetitions avoids eddy currents and renders the pulse sequence virtually silent. In some implementations, the readout gradient present during RF excitation uses excitation bandwidths equal or wider than the imaging bandwidth, resulting in short, non-selective RF block-pulses with flip angles below the corresponding Ernst angle resulting in native PD-weighted image contrast. The inverse logarithmic scaling (i.e., −log(image)) inverts and stretches the image contrast towards CT-like appearance with bone appearing warm and soft tissue cold, in front of a hot background. In comparison to the native linearly-scaled images, this significantly improves bone visualization.

PD-weighted short TE based MR bone depiction in accordance with embodiments is fundamentally different from methods presented in the literature so far. As opposed to UTE-based methods that mostly explore T2 relaxation differences, embodying methods utilize PD differences. As such, embodying systems and methods do not require specific long T2 suppression methods, like echo subtraction or application of saturation or inversion pulses. This significantly adds to the accuracy, robustness, and speed of the method, in particular in comparison to UTE-based alternatives. The proposed method also does not require prior knowledge in form of an atlas, or template.

Embodying systems and methods can be used in applications for accurate characterization of bone attenuation such as MR-based PET attenuation correction, radiation therapy planning, and/or MR-guided focused ultrasound—along with musculoskeletal applications and detection of traumatic head and spine fractures.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods discussed herein such as a method for PD-weighted short TE MR imaging in combination with an inverse logarithmic scaling for depiction of cortical bone tissue, along with bias correction for bone segmentation, as described above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method of classifying component tissues of magnetic resonance images, the method comprising:
   performing a proton density contrast weighted, short echo-time magnetic resonance imaging measurement over a first volume field-of-view region of interest (ROI);
   repeating a series refining the first volume field-of-view ROI into a plurality of subsequent smaller ROI volumes having respective smaller resolutions;
   reconstructing a complex image from the plurality of magnetic resonance imaging measurements;
   performing a bias correction on at least one of the plurality of subsequent smaller ROI volumes; and
   classifying the ROI volumes by tissue type based on the bias-corrected image signal, wherein at least one tissue type is bone.

2. The method of claim 1, including obtaining the short echo time magnetic resonance imaging measurement using a zero TE imaging technique.

3. The method of claim 1, including obtaining the short echo time magnetic resonance imaging measurement using an Ultra-Short TE imaging technique.

4. The method of claim 1, including finding factors for the bias correction using a histogram of an image signal in the ROI volumes.

5. The method of claim 4, including updating a bias correction iteratively based on signal statistics.

6. The method of claim 1, including applying an inverse-logarithm operation to the image.

7. The method of claim 1, including deriving the tissue type classification from the image signal histogram.

8. The method of claim 1, including refining the tissue type classification by morphologic and distance transform operations.

9. The method of claim 1, including determining a composition of multiple tissue types within ROI volumes.

10. The method of claim 1, including guiding the tissue type classification by a complex image phase within ROI volumes.

11. The method of claim 1, including guiding the tissue type classification by anatomical prior knowledge.

12. A non-transitory computer readable medium having stored thereon instructions which when executed by a processor cause the processor to perform a method of classifying component tissues of magnetic resonance images, the method comprising:
   performing a proton density contrast weighted, short echo-time magnetic resonance imaging measurement over a first volume field-of-view region of interest (ROI);
   repeating a series refining the first volume field-of-view ROI into a plurality of subsequent smaller ROI volumes having respective smaller resolutions;
   reconstructing a complex image from the plurality of magnetic resonance imaging measurements;
   performing a bias correction on at least one of the plurality of subsequent smaller ROI volumes; and
   classifying the ROI volumes by tissue type based on the bias-corrected image signal, wherein at least one tissue type is bone.

13. The medium of claim 12 including instructions to cause the processor to perform the step of obtaining the short echo time magnetic resonance imaging measurement using a Short-TE imaging technique.

14. The medium of claim 12 including instructions to cause the processor to perform the step of obtaining the short echo time magnetic resonance imaging measurement using an Ultra-Short TE imaging technique.

15. The medium of claim 12 including instructions to cause the processor to perform the step of finding factors for the bias correction using a histogram of an image signal in the ROI volumes.

16. The medium of claim 15 including instructions to cause the processor to perform the step of updating a bias correction iteratively based on signal statistics.

17. The medium of claim 12 including instructions to cause the processor to perform the step of applying an inverse-logarithm operation to the image.

18. The medium of claim 12 including instructions to cause the processor to perform the step of deriving the tissue type classification from the image signal histogram.

19. The medium of claim 12 including instructions to cause the processor to perform the step of refining the tissue type classification by morphologic and distance transform operations.

20. The medium of claim 12 including instructions to cause the processor to perform the step of applying anatomical prior knowledge to obtain the tissue type classification.

21. The medium of claim 12 including instructions to cause the processor to perform the step of guiding the tissue type classification by a complex image phase within ROI volumes.

* * * * *